United States Patent [19]

Koch

[11] 4,410,811

[45] Oct. 18, 1983

[54] METHOD FOR THE OPERATION OF A CID SENSOR MATRIX

[75] Inventor: Rudolf Koch, Munich, Fed. Rep. of Germany

[73] Assignee: Siemens Aktiengesellschaft, Berlin & Munich, Fed. Rep. of Germany

[21] Appl. No.: 778,987

[22] Filed: Mar. 18, 1977

[51] Int. Cl.³ .................. H03K 3/42; H01L 29/78; H01L 27/14; H01L 31/00

[52] U.S. Cl. .................. 307/311; 357/30; 357/24

[58] Field of Search ........... 357/24, 30; 307/311

[56] References Cited

U.S. PATENT DOCUMENTS

| | | | |
|---|---|---|---|
| 3,781,574 | 12/1973 | White et al. | 357/24 |
| 3,806,729 | 4/1974 | Caywood | 357/24 |
| 4,016,550 | 4/1977 | Weimer | 357/24 |

OTHER PUBLICATIONS

Boonstra et al., "Analog Functions Fit Neatly Onto Charge Transport Chips" Electronics (Feb. 28, 1972) pp. 64-71.
Sequin et al., *Charge Transfer Devices* Academic Press, New York (7/75) pp. 52-56, 166-169, 196-197.
Milton et al., "Series-Parallel Scan IR CID Focal Plane Array Concept" Int. Conf. Application of Charge-Coupled Devices, San Diego (10/75), Proc. pp. 71-83.

*Primary Examiner*—Gene M. Munson
*Attorney, Agent, or Firm*—Hill, Van Santen, Steadman & Simpson

[57] ABSTRACT

A method for the operation of a CID sensor matrix, in accordance with the parallel injection readout method, having coordinate rows and column lines, and sensing elements at the line intersections, in the operation of which the charges of the sensing elements of a row are transferred to the column lines and subsequently serially transferred, over corresponding column lines, to output means, in which the information charges of a selected row are shifted to the associated column line, the charge values on the column lines, are shifted, in parallel, out of the matrix proper into parallel temporary storage positions, and the charge values are serially readout from said temporary storage positions, with the information charges in the matrix proper being simultaneously erased, and following readout, any stored charge values at said temporary storage positions being erased, and to apparatus for practicing such method.

5 Claims, 5 Drawing Figures

METHOD FOR THE OPERATION OF A CID SENSOR MATRIX

BACKGROUND OF THE INVENTION

The invention relates to a method for the operation of a CID sensor matrix in accordance with the "parallel-injection-readout" method.

CID sensor matrices are known and have been described, for example, in the publication "Charge Injection Imaging" ISSCC Digest of Technical Papers, pages 138–139, Feburary 1973, G. J. Michon and H. K. Burke, which illustrates CID sensor matrices of this type constructed in such manner that image points arranged in rows and columns of a matrix configuration are provided on a surface of a substrate comprising doped semiconductor material and including a substrate terminal. Each image point consists of two MIS capacitors which are disposed closely adjacent one another and coupled to each other over the substrate. Such coupling can be so effected that the interspace between the two capacitors is bridged by a zone disposed on the surface of such substrate and doped oppositely thereto, or by a construction in which the interspace between the two gate electrodes of the capacitors is made sufficiently small. In a row of image points, the gate electrode of one of the two image point capacitors of the row is in each case connected to a corresponding row line, and the gate electrodes of the other capacitors are connected to respective column lines associated with each corresponding image point column.

In a simple method for effecting image recording of a CID sensor matrix of this type, all the column lines and row lines are connected to voltages which, with respect to a reference potential across the substrate terminal, are such that depletion zones are produced on the substrate surface at the MIS-capacitors, in which zone the information charge carriers produced by the image light are accumulated and stored. Read-out in such case is effected serially, i.e. image-point-wise, by injecting the stored inversion charge into the substrate and by integrating the substrate current. On the basis of the integrating operation, this method exhibits favorable properties with respect to pulse train input-couplings which disturb the output signal. However, the low cut-off frequency arising from the serial read-out must be deemed a disadvantage.

Higher cut-off frequencies can be achieved by the utilization of the "parallel-injection-readout" method heretofore referred to. This method is described in the publication "Charge Injection Devices for Solid State Imaging", Nato Advanced Study Institute for Solid State Imaging, Sept. 3–12, 1975, Universite Catholique de Louvain by G. J. Michon and H. K. Burke, in which an operating cycle commences with the erasure of the image points, followed by the setting of the store matrix into the image recording state and the read-out. In contrast to the methods heretofore described, in this case the read-out and the erasing operation are separated. The erasing operation is effected by simultaneously connecting all column lines over a suitable device, for example over multiplex transistors, to a voltage which is such, relative to the substrate potential, that any information charges stored in the corresponding capacitors are injected into the substrate. The setting of the matrix into the image recording state is effected by simultaneously bringing the column lines to a bias voltage relative to the substrate potential which is then clamped. Again, this can be effected over the multiplex transistors by connecting suitable voltages thereto. The bias voltage is so selected that a depletion zone (inversion edge layer) exists below the corresponding capacitors. At the same time, all row lines are likewise brought to a voltage which is so selected that a depletion zone (inversion edge layer) exists below the associated capacitors.

With the sensor matrix so set in the image recording state, information charge carriers produced by light accumulate in the depletion zones where they are stored. The read-out now takes place in a row-parallel manner with the voltage on a selected row line being so reduced that the start voltage of the capacitors conncted to such line is almost reached or is even undershot. The information charge carriers stored in the depletion zones of such capacitors are thus moved below the adjacent capacitors associated with the column lines, as a result of which a potential change takes place on the column lines, which change, relative to the bias voltage, is representative of the information stored in the image points of the row. The information thus is now stored in the column lines which can be readily read out by means of suitable devices. The lastmentioned publication refers to a device by means of which the column lines may be read out consecutively, and when the read-out operation has been completed, a new operating cycle commences with another selected row.

While the "parallel-injection-readout" method possesses a high insensitivity to blooming, it has the disadvantage that the operation is not integral. Different pulse train input-couplings during the shifting of the charges and different pulse train input-couplings of the multiplex transistors or of corresponding arrangements occur in the output signal and produce a "fixed noise pattern".

BRIEF SUMMARY OF THE INVENTION

The invention has as its primary objective, to improve methods of the type described which, in accordance with one feature of the invention, is achieved by effecting the final setting-up of the bias voltages on the column lines in accordance with the bucket chain principle, over suitable bucket chain transistors particularly provided for such purpose.

The bucket chain principle is known and is described, for example, in detail in the publication "Analog-functions fit neatly onto charge transport chips" in Electronics, Feb. 28, 1972, pages 64–71, by L. Boonstra and F. L. J. Sangster. As herein referred to, a bucket chain stage is to be understood as merely one individual stage of a bucket chain. As illustrated in the Figure on the title page of the lastmentioned publication, such an individual stage may consist of a transistor, whose one electrode is connected over a capacitor to the control electrode. This connection, however, is of subordinate importance in the present instance, and even though the corresponding capacitor electrode is not connected to the control electrode but possesses a free terminal, will also be considered as a bucket chain stage. It might also be mentioned that all possible arrangements based on the equivalent circuit diagram of a bucket chain stage, such as that described above are basically suitable.

The arrangement according to the invention has, in particular, the advantages that, in comparison to sensors operated conventionally, a sensor operated in accordance with the invention possesses a higher insensitivity to blooming, no smearing occurs, and the different pulse train input-couplings from the multiplex transistors or corresponding devices do not adversely influence the signal.

In an advantageous further development of the method of the invention, the information stored in the column lines is read from the latter in parallel to a charge-coupled shift device and the input information is serially read out of the latter. In this case, it is advantageous that the parallel input take place very rapidly and it is possible, following such input, to immediately commence a new operating cycle.

In an advantageous further development of the method of the invention, the parallel input of the information stored on the column lines takes place in accordance with the bucket chain principle, with each column line being connected over a bucket chain stage to the parallel input of the shift device, and the setting-up of the bias voltage thus may take place over such bucket chain stages, while the charges which thus flow into the shift device discharged from the latter, likewise in accordance with the bucket chain principle, over additional bucket chain stages provided for this purpose on the other side of the shift device.

However, in accordance with the above arrangements, only the different pulse train input-couplings of the multiplex transistors can be eliminated, and in a further advantageous embodiment of the method, it is also possible to eliminate pulse train input coupling which occurs during the shifting of the charges in the CID matrix. This is achieved by use of multiplex switches to set up the bias voltage in which, immediately following the parallel input into the shift device, another operating cycle with the same row follows in which the image recording state is selected for so short a period of time that no noticeable light produced information can be stored. This "zero" information may then be stored in the column lines and input in parallel into a second charge-coupled shift device (CCD), with the two shift devices being simultaneously read out in serial manner to a difference forming device, which in each case forms the difference between the two signal values belonging to a particular column line, with the difference value thus forming the output signal. The undesired pulse train couplings are thereby cancelled.

Preferably the method is so carried out that the parallel input of the information stored on the column lines into the shift devices is effected in accordance with the bucket chain principle, whereby each column line is connected over at least one bucket chain stage to the cooperable parallel input of the particular shift device.

BRIEF DESCRIPTION OF THE DRAWINGS

In the drawings wherein like reference numerals indicate like or corresponding parts.

DETAILED DESCRIPTION OF THE INVENTION

Figure 1:
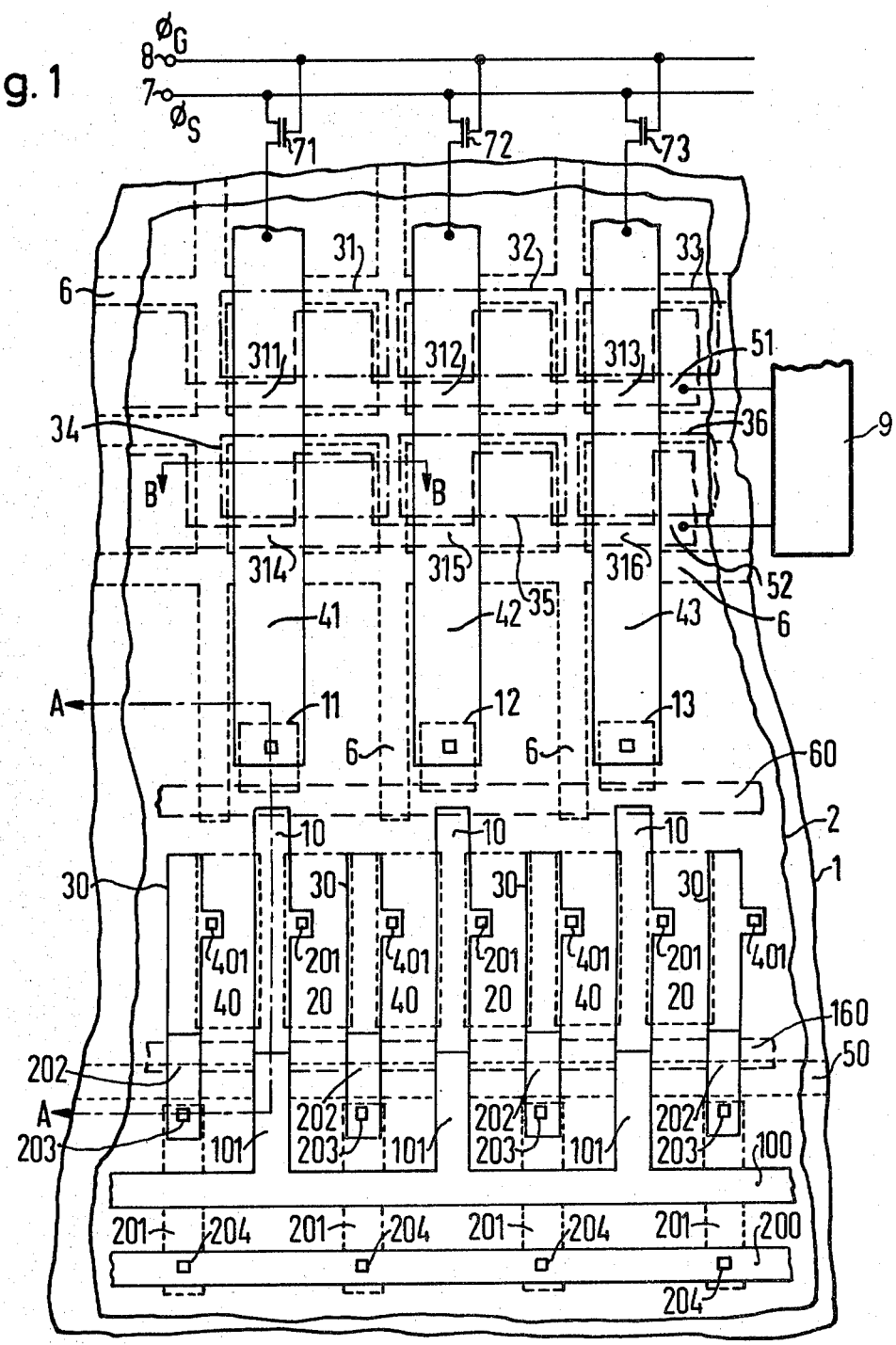
FIG. 1 is a plan view of a portion of a matrix structure in the operation of which pulse train input-couplings of the multiplex transistors can be eliminated.

Referring to the drawings and more particularly to FIG. 1, the sensor matrix therein illustrated has a substrate 1 of doped semiconductor material upon the surface of which is disposed an insulating layer 2, upon which image points 31 to 36 of the sensor matrix are disposed. The column lines 41 to 43 are formed from aluminum and the row lines 51 and 52 comprise polysilicon strips, with the aluminum lines extending across the polysilicon lines. Individual image points are operatively separated from one another by a "channel-stop" diffusion 6. Further details with respect to the image points will be presented in connection with FIG. 3 of the drawings.

The aluminum lines 41 to 43 are connected to a voltage supply terminal 7 over respective multiplex transistors 71 to 73, while the control electrodes of such multiplex transistors are connected to a voltage supply terminal 8. Each row line is operatively connected to a row selector circuit, indicated generally by the reference numeral 9, while each column line is electrically conductively connected over a corresponding contact hole in the insulating layer through which the electrode may extend to a respective zone 11, 12, 13 which are located on the surface of the substrate and doped oppositely thereto. A charge coupled shift device comprising electrode groups 10 to 40 are provided on the surface of the electrically insulating layer adjacent such doped zones. In this particular instance a shift device for two-phase operation is involved.

Charge-coupled shift devices are generally known, their construction and mode of operation being readily ascertained, for example, from the publication "Charge-Coupled Digital Circuits," IEEE Journal of Solid State Circuits, volume SC-6, No. 5, October 1971 by W. F. Kosonockl et al and from Pat. Nos. 3,759,794 and 3,760,202, corresponding to German OS No. 2,201,150, and FIG. 9 of the latter illustrates a cross-section through a charge-coupled shift device for two-phase operation similar to that here involved. The electrodes 10 and 30 of FIG. 1 hereof may comprise aluminum, while electrodes 20 and 40 may comprise polysilicon with the electrically conductive connection between the aluminum electrodes and the adjacent polysilicon electrodes located to the right of the respective aluminum electrodes being effected by contact holes 201 and 401 in the insulating layer through which, for example, the aluminum electrode may extend to the polysilicon electrode.

Between the doped zones 11, 12, 13 and the shift device, is positioned a transfer electrode 60 which is disposed on the electrically insulating layer and is in the form of a strip of polysilicon which slightly overlaps the doped zones and at the same time is partially overlapped by the respective electrodes 10. Positioned at the opposite longitudinal side of the shift device, and disposed on the surface of the substrate is a strip 50, which is doped oppositely to such surface and which includes a connection contact (not illustrated). Also disposed on the electrically insulating layer, between the shift device and the doped strip 50, is a second transfer electrode 160, also in the form of a polysilicon strip which partially overlaps the doped zone, and is in turn overlapped by the electrodes 10. Such electrodes 10 are connected to a pulse train line 100, illustrated as being in the form of an aluminum strip disposed on the electrically insulating layer, while the electrodes 30 are connected to a second pulse train line 200, likewise in the form of an aluminum strip disposed on the electrically insulating layer. Operative connection between the electrodes 10 and the pulse train line 100 is achieved by means of aluminum strips 101, while the electrodes 30 are connected to the polysilicon strips 201 by aluminum strips 202, the metal of which may extend through contact holes 203 to the associated polysilicon strip. The polysilicon strips 201 likewise are connected to the second pulse train line 200 by means of contact holes 204.

Figure 2:
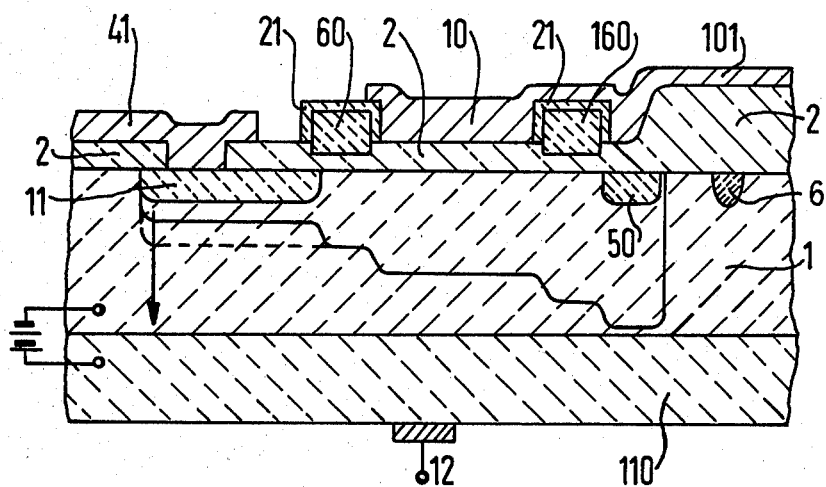
FIG. 2 is a transverse section taken approximately on the line A—A of FIG. 1.

Referring to FIG. 2, the substrate 1 comprises an epitaxial layer, for example p-doped silicon, which is applied to an oppositely doped substrate 110 comprising semiconductor material, for example n-doped silicon. The epitaxial layer is connected, over a voltage source and the oppositely doped substrate, to the substrate terminal 12. The electrically insulating layer 2, may, for example, comprise silicon dioxide, and the respective transfer electrodes 60 and 160 may be covered with a silicon dioxide layer 21.

The doped zone 11, transfer electrode 60 and electrode 10 are operated as a bucket-chain stage, and in like manner the electrode 10, the transfer electrode 160 and strip 50 may form a second stage. The final setting-up of the bias voltage is effected over the transfer electrode 60 with the transfer of electrode 160 likewise being opened for this purpose, whereby the charge from the column line can discharge through the shift device to the strip 50. A qualitative representation of the course of the surface potential in the final setting up of the bias voltage is depicted in FIG. 2, in which charge flows out of the zone 11 into the strip 50 until the surface potential in the zone 11 has reached the value of the surface potential beneath the transfer electrode 60, as illustrated by the broken lines. The input of the information charge into the shift device takes place similarly, but for this purpose the transfer electrode 160 is closed by means of the application of an appropriate voltage thereto.

Figure 3:
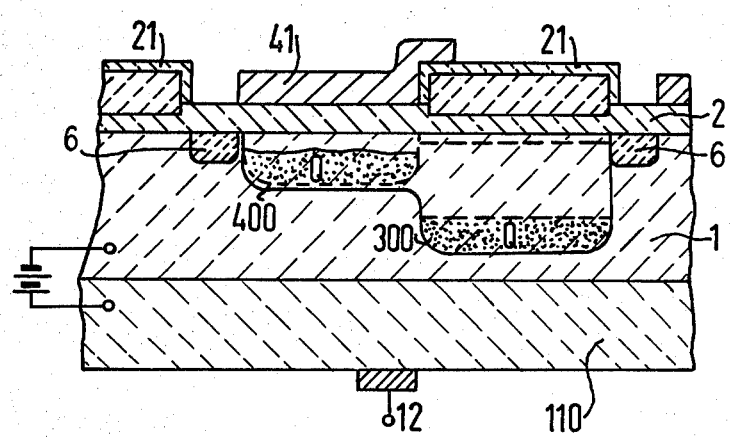
FIG. 3 is a transverse section taken approximately on the line B—B of FIG. 1.

As illustrated in FIG. 3, which is a cross-sectional view through an image point of the sensor matrix, taken approximately on the line B—B of FIG. 1, the gate electrode of the capacitor which is associated with the row line is comprised of polysilicon and has a portion located on the right-hand side of the column line within the boundaries of the image point 34. The gate electrode of the capacitor connected to the column line likewise is formed by that portion of the aluminum strip 41 located within the boundaries of the image point 34. The polysilicon gate electrodes in the embodiment illustrated are connected by narrow, strip-shaped polysilicon connection 311 to 316, with the aluminum strips 41 to 43 extending thereacross in insulated relation as a result of a thin layer 21 of silicon dioxide which covers the polysilicon electrodes. As will be apparent from a reference to FIG. 3, the two cpaacitors are coupled by an overlapping of the aluminum gate upon the polysilicon gate. Separation of the image points from one another is effected in known manner by suitable "channel stop" diffusions 6. A qualitative representation of the course of the surface potential during the image recording state is depicted by the curve 300 and, following shift of the charge, by the curve 400 with the dotted portion representing a stored information charge Q.

An operating cycle will be explained in detail with reference to FIG. 4 in which the image recording state will be taken as the initial starting basis. In the figure, diagram I depicts the course of potential on the row line selected for the operating cycle, relative to time, while diagram II similarly depicts the potential of the row line which is to be selected for the next operating cycle; diagram III depicts the potential on the column line, while diagrams IV and V depict the potential courses of voltages to be applied to the transfer electrode 60 and to the transfer electrode 160. Diagrams VI and VII depict the potential courses of voltages employed to operate the columns for the charge injection and the pre-setting of the bias voltage.

Following the setting of all column lines to the bias voltage, the potential of the selected row line is reduced at the time $t_1$ until the start voltage of the capacitors connected to such row is almost reached or is undershot. The information charges which have accumulated in the capacitors below the row lines are shifted beneath the other capacitors of the image points, as a result of which a change occurs in the potential on the respective column lines. At the time $t_2$, the transfer electrode 60 is opened, as a result of which the charge quantity corresponding to the potential charge on each of the column lines is, is accordance with the bucket-chain principle, moved in a parallel operation to below the corresponding electrodes 10 of the shift device, and at the end of this operation, i.e. at the time $t_3$, the transfer electrode is again closed. Reading out of the shift device may then take place and at the time $t_4$, the charge injections take place to effect an erasure of the sensor elements and to set the column lines to a temporary bias voltage over the associated multiplex transistors. In the present instance, a temporary bias voltage is employed which is lower than the normal bias voltage. If an n-doped substrate were employed, a higher temporary bias voltage would be employed.

Figure 4:
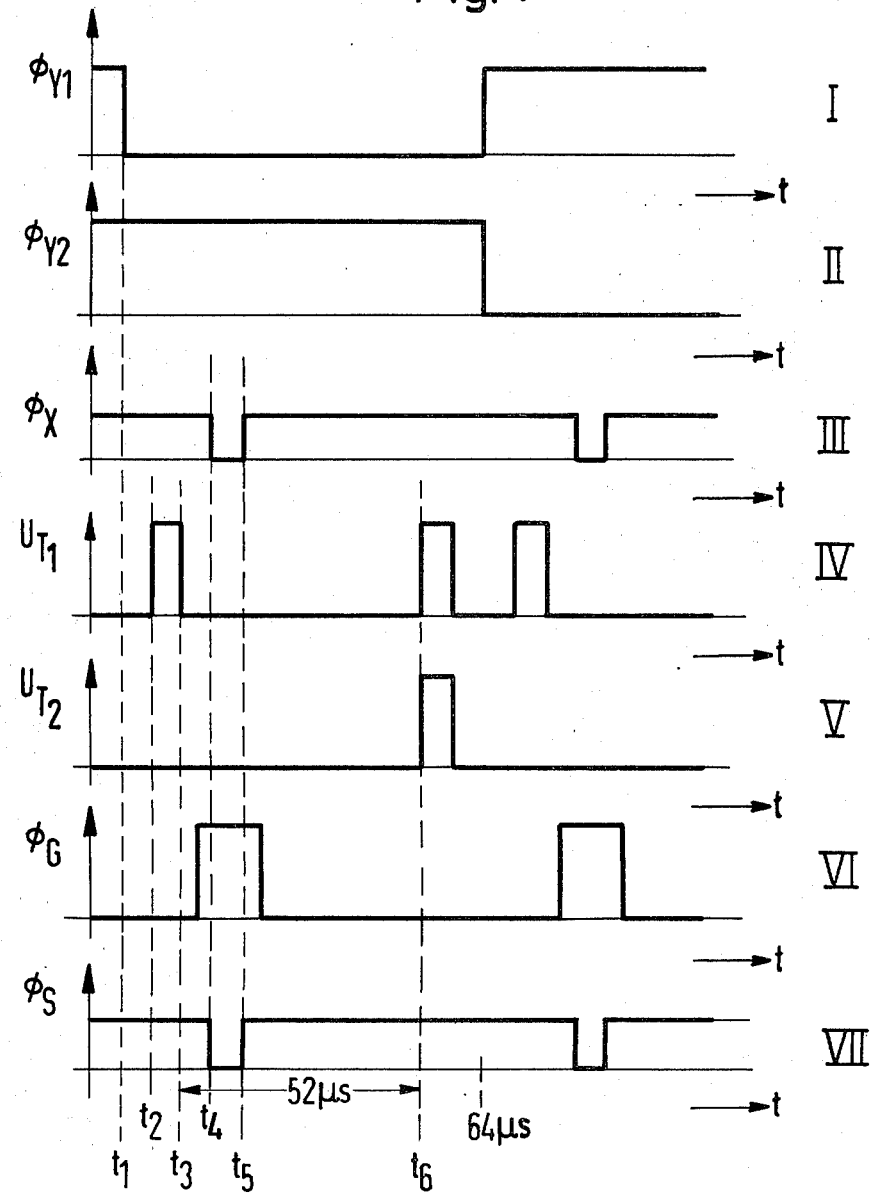
FIG. 4 is a chart illustrating pulse diagrams in connection with the method of operation of the device illustrated in FIG. 1.

At the time $t_5$ the multiplex transistors are again closed as will be apparent from diagram VII of FIG. 4.

In order to eliminate the different pulse train input-couplings of the multiplex transistors, the final setting up of the bias voltage takes place in accordance with the bucket-chain principle, following the read-out of the shift device by two phase operation resulting from the applcation of corresponding pulse trains to the lines 100 and 200. Thus, at the time $t_6$, the transfer electrode 60 as well as the transfer electrode 160 are fully opened whereby the information charges are discharged from the column lines by the shift device to the doped strip 50. By a suitable selection of the potentials and of the transmission time, a predetermined residual charge can be maintained on the column lines. The transmission of small quantities of charge in accordance with the bucket chain principle is accelerated by such predetermined residual charge. The capacitance of an electrode of the shift device preferably should be approximately equal to that of a gate electrode of an image point, whereby the same voltage range is involved. The operating cycle for the next selected electrode is initiated at the time $t_7$.

The sensor arrangement above described is suitable for television pictures, in which case the information is stored in the image points of each row and is entered in parallel, in accordance with the bucket chain principle, into the shift device during the row blanking of the television picture and then during the remainder of the time is read-out serially at a high speed generally corresponding to that of a television row.

The setting of the column lines to the temporary bias voltage, following each read-out operation, does not result in a fade-out phenomena, as normally occurs with circuits operating in accordance with the bucket-chain principle, as a result of which the device can be permitted relatively high transmission losses of over 50%.

Figure 5:
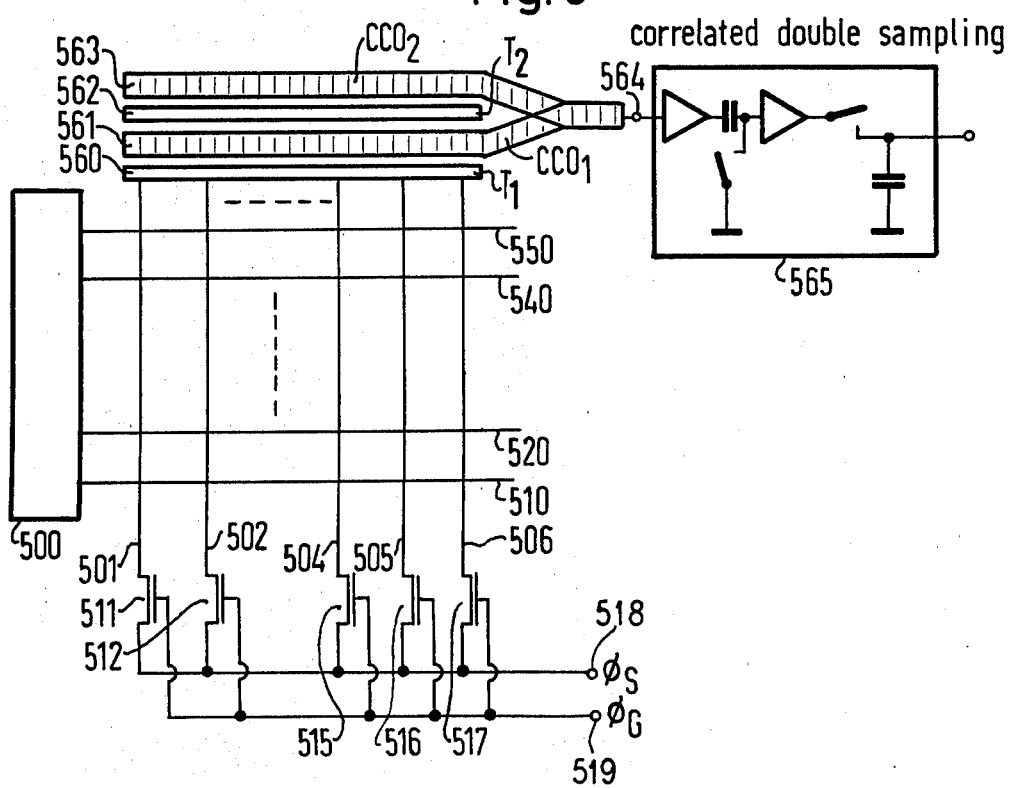
FIG. 5 is a schematic diagram illustrating the construction of a device, in accordance with the invention, in which elimination of the pulse train input-couplings during the shifting of the charges in the sensor matrix may be eliminated.

FIG. 5 illustrates a device by means of which it is possible to additionally eliminate the pulse train input-coupling occurring during the shift of the information charges in the CID sensor matrix. While the device is schematically illustrated in FIG. 5, it will be apparent that it can be constructed in a manner similar to that illustrated in FIG. 1. The column lines are assumed to be represented by the lines 501 to 506 and the row lines by the lines 510 to 550. The row lines are connected to a row selector circuit 500 in a manner corresponding to that illustrated in FIG. 1 and the column lines are connected over multiplex transistors 511 to 517 to a terminal 518, while the control electrodes of the transistors are connected to a terminal 519. Likewise, generally corresponding to FIG. 1, the column lines can be read, in parallel, into a charge-coupled shift device 561 over a transfer electrode 560.

However, the charge coupled shift device can also be read in parallel into a second charge-coupled shift device 563 over an additional transfer electrode 562, with the two charge-coupled shift devices being suitably combined in known manner at a common output 564, which is connected to a cooperable double sampling stage 565.

The operation of the device illustrated in FIG. 5 will be described on the same assumption as that of FIG. 1, i.e., that the sensor matrix is initially in the image recording state in which the column lines carry bias voltage and the row lines carry sufficiently high potential. As a result of the reduction of the potential of a selected row line, as in the operation of FIG. 1, the information charges are moved below the adjacent capacitor electrodes of the column lines. The charges corresponding to the voltage values on the column lines are subsequently brought into the second shift device 563, in accordance with the bucket chain principle, over transfer electrode 560 and transfer electrode 562 by means of the charge-coupled shift device 561. The transfer electrodes are then closed and a new operating cycle with the same row is initiated. Thus, the potential of the column lines is reduced over the multiplex transistors to such an extent that the stored information charges are injected, with the selected row again being brought to high potential, and the column lines being reset to the bias potential over the multiplex transistors. The potential of the row line is then reduced as previously described for the second time and a charge quantity of zero is displaced. A further read-in of the column lines takes place, this time into the shift device 561, in accordance with the bucket chain principle, over the transfer electrode 560. While the two shift devices are then subsequently read out in serial fashion, the potential of the row line is brought to the desired correspondingly high potential value and the bias voltage is set up on the column lines over the multiplex transistors. The difference between the two signals belonging to a column is formed in each case in the correlated double sampling stage at the common output of the two shift devices, as a result of which the pulse train input-coupling of the charge shift is eliminated in the same manner as the influence of the start voltages of the column transistors.

The arrangement illustrated in FIG. 5 can be simplified with the employment of only a single shift device which in such case would be of double length, i.e. two bits per column line. After the first read-in, the information is advanced by one bit and the zero information is read into the newly freed element. The two signals belonging to a column are thereby stored, in each case, in two series-connected store positions.

The basic principle of the method above described, comprising two shift devices or one shift device with a double number of elements, resides in the fact that the difference between the signal including the pulse train input-couplings and only the pulse train input-couplings themselves is formed. As a result, the pulse train input-couplings are cancelled out and a signal entirely free thereof is derived at the output.

Having thus described my invention it will be obvious that although various minor modifications might be suggested by those versed in the art, it should be understood that I wish to embody within the scope of the patent granted hereon all such modifications as reasonably, and properly come within the scope of may contribution to the art.

I claim as my invention:

1. In a method for the operation of a charge injection device (CID) sensor matrix, in accordance with the parallel injection readout method, having coordinate row and column lines, and light sensing elements at the line intersections, in the operation of which the sensed information charges of the sensing elements of a row are transferred to the column lines and sensed information there stored is read from the column lines in parallel into a charge-coupled shift device and the read-in information is serially read out from the latter, the combination of the steps of erasing in parallel the charges on the sensing elements, following a first readout, and repeating a readout from the same row, in such manner that the light sensing duration is sufficiently short that no appreciable information produced by light can be stored prior to such repeat readout, reading out such "zero information", stored in the column lines, in parallel into a second charged-coupled shift device, serially reading out the information of the two shift devices in common, and forming the difference between the stored information, in each shift device, pertaining to the same column, with such difference value representing the output signal for such column.

2. A method according to claim 1, wherein the parallel input of the sensed information, stored on the column lines, into the shift devices is effected in accordance with the bucket chain principle, by coupling each respective column line over at least one bucket chain stage to the respective cooperable parallel input of each shift device.

3. A method according to claim 2, wherein the sensed information stored on the column lines from the first readout is input in parallel, in accordance with the bucket chain principle, into the first shift device and from there in parallel into the second shift device, and that from the second readout is input in parallel into the first shift device.

4. A method according to claim 2 wherein a single shift device is utilized which is provided with two storage positions for each column, into each of which parallel input may be effected, and effecting parallel input of the storage charges of the first readout into one of the storage positions for each column, and subsequently effecting parallel input of the "zero information" of the second readout into the other of the storage positions for each column.

5. A method according to claim 1, wherein a single shift device is utilized which is provided with two storage positions for each column, into each of which parallel input may be effected, and effecting parallel input of the storage charges of the first readout into one of the storage positions for each column, and subsequently effecting parallel input of the "zero information" of the second readout into the other of the storage positions for each column.

* * * * *